United States Patent
Voldman

(10) Patent No.: US 6,762,918 B2
(45) Date of Patent: Jul. 13, 2004

(54) FAULT FREE FUSE NETWORK

(75) Inventor: Steven Howard Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/063,858

(22) Filed: May 20, 2002

(65) Prior Publication Data

US 2003/0213978 A1 Nov. 20, 2003

(51) Int. Cl.$^7$ .............................. H02H 3/20; H02H 9/04

(52) U.S. Cl. ....................................... 361/91.1; 257/355

(58) Field of Search ........................... 361/91, 90, 91.1, 361/57, 91.61, 56; 327/525, 252; 257/758, 355, 356, 357, 358, 359, 360, 361, 200, 365

(56) References Cited

U.S. PATENT DOCUMENTS

| 5,159,518 | A | * | 10/1992 | Roy | 361/56 |
| 5,452,171 | A | | 9/1995 | Metz et al. | 361/56 |
| 5,610,790 | A | | 3/1997 | Staab et al. | 361/56 |
| 5,880,917 | A | | 3/1999 | Casper et al. | 361/56 |
| 5,910,874 | A | | 6/1999 | Iniewski et al. | 361/56 |
| 5,956,219 | A | | 9/1999 | Maloney | 361/56 |
| 5,963,409 | A | | 10/1999 | Chang | 361/56 |
| 6,074,899 | A | | 6/2000 | Voldman | 438/155 |
| 6,281,702 | B1 | | 8/2001 | Hui | 326/30 |
| 6,319,333 | B1 | * | 11/2001 | Noble | 148/33.2 |
| 2003/0016074 | A1 | * | 1/2003 | Yung | 327/525 |

FOREIGN PATENT DOCUMENTS

JP    2000216673    8/2000

* cited by examiner

*Primary Examiner*—Long Pham
*Assistant Examiner*—Dana Farahani
(74) *Attorney, Agent, or Firm*—Richard A. Henkler

(57) ABSTRACT

A fuse state circuit for reading the state of a fuse that is enhanced to reduce the circuits susceptibility to ESD, EOS or CDM events.

11 Claims, 4 Drawing Sheets

FAULT FREE FUSE NETWORK

BACKGROUND OF THE INVENTION

1. Field of the Invention

The present invention generally relates to fuse networks, and, more particularly, to providing fault tolerance for fuse networks in integrated circuits.

2. Description of the Related Art

As integrated circuits have become more complicated offering greater functionality, fuse networks have become an integral part of the overall design process. Fuse networks are currently being used for enabling or disabling circuits/circuit blocks, and thereby, providing differing functionality (e.g. customized) without the need to have multiple masks or other redundant circuit processes. In addition, fuse networks are also being used to correct defects in circuits that result from various manufacturing deffiencies (e.g. photolithographis, etch, masking, process).

Obviously, in order to make the fuse(s) useful, some type of circuitry must be used to determine the state of the fuse (e.g. open/close). Fuses are typically blown (opened) via electrical means (e.g. electrical fuse blow) or optical means (e.g., Laser fuse blow). Unfortunately, the techniques used for blowing the fuse can induce enough energy to lead to Electrical OverStress (EOS) or ElectroStatic Discharge (ESD) failure of the circuitry used to read the state of the fuse ("Fuse state circuitry"). For example, electrical fuse blow can lead to currents which cause failure of the fuse element and the fuse state circuitry at the same time. In further example, laser fuse blow can lead to conversion of optical to thermal energy where the thermal energy can lead to an electrical current, forming a pulsed electrical event propagating into the fuse state circuitry.

It would, therefore, be a distinct advantage to have fuse state circuitry that was protected from both EOS and ESD events. The present invention provides such state circuitry.

BRIEF SUMMARY OF THE INVENTION

The present invention is applicable to fuse networks, and more specifically, to the circuitry that reads the state of the fuse(s) in such networks. The present invention provides ESD, EOS, and CDM protection to the circuitry that reads the state of such fuse(s).

BRIEF DESCRIPTION OF THE SEVERAL VIEWS OF THE DRAWINGS

The foregoing and other objects, aspects and advantages will be better understood from the following detailed description of a preferred embodiment of the invention with reference to the drawings, in which.

DETAILED DESCRIPTION OF THE INVENTION

Detailed Description of a Preferred Embodiment of the Invention

Figure 1:
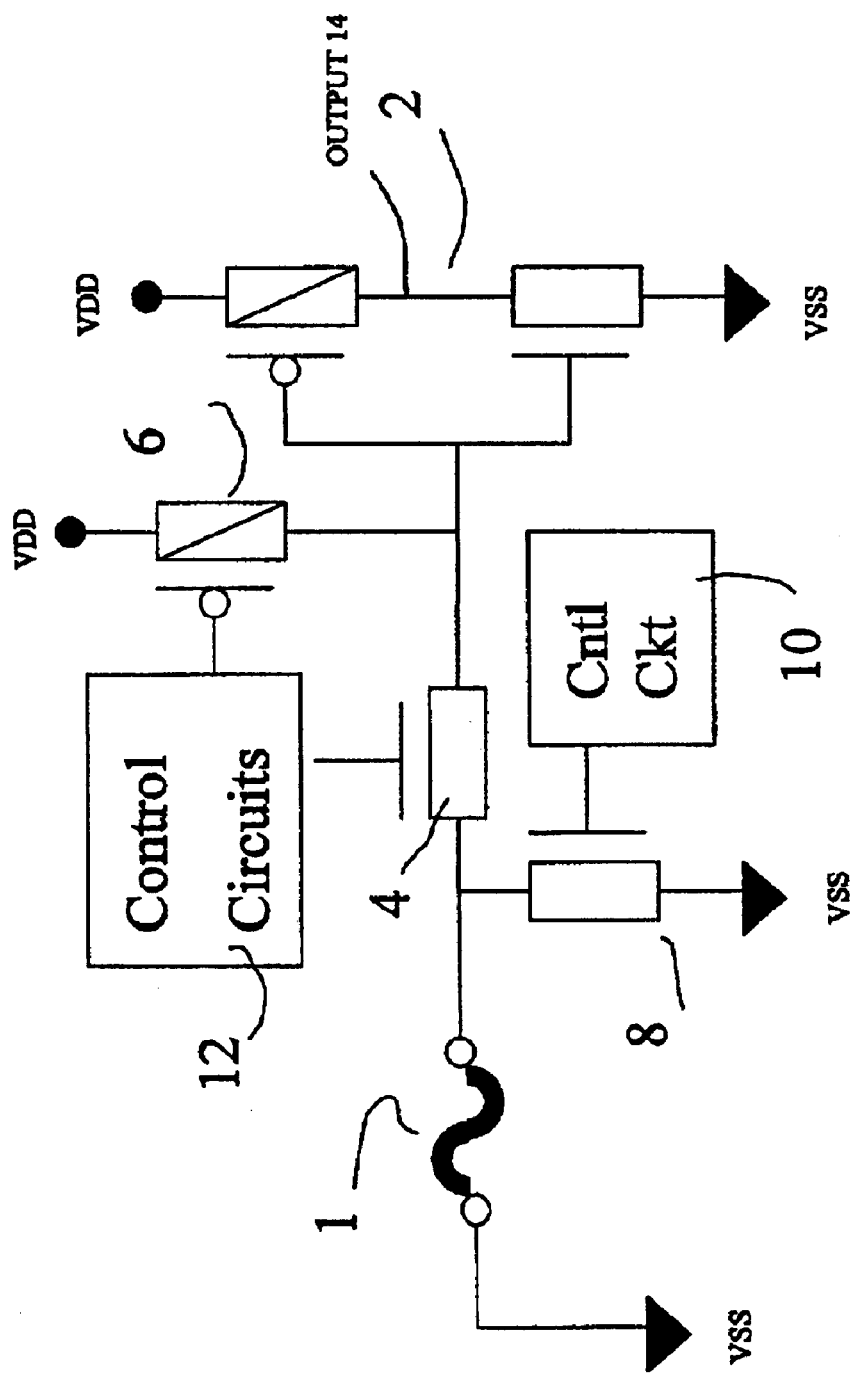
FIG. 1 is a schematic diagram representative of an environment in which a fuse network can be used.

Referring now to the drawings, and more particularly to FIG. 1, there is shown a schematic diagram representative of an environment in which a fuse network can be used. The fuse network includes, a fuse 1, a receiver circuit 2, half pass NFET 4, NFET 8, PFET 6, and control circuitry 10 and 12. In this example, fuse structure 1 is connected to ground potential on one side and to half pass NFET 4 and NFET 8 on the other side. NFET 8 and NFET 4 are coupled to PFET 6 and receiver 2.

The receiver circuit 2 can be a simple inverter (PFET/NFET in the configuration as shown). If the fuse element 1 is intact, then the output side of the fuse will read "0" pulling the input to the NFET 4 to a low state. Provided the gate of the half pass NFET 4 is enabled on, the fuse 1 pulls the circuitry low forming a high state at the output 14 (i.e. state=fuse intact). If, however, the fuse 1 is blown, then the fuse pulls the circuitry high forming a low state at the output 14 (i.e. state=fuse blown).

Additional control circuit elements 12, 10, 8, and 6 are included to determine and verify the state of the fuse 1. Circuit element 8 is an NFET device tied to ground whose gate is connected to control circuity 10 for determining the fuse state. For example, when the control circuitry 10 is enabled to place a voltage on the gate of the NFET 8, the input of the NFET pass transistor 4 can be pulled low by turning NFET 8 in an on state. PFET pull-up element 6 and control circuitry 12 can be used to pull the input node of the receiver 2 to a high state by enabling PFET pull-up element 6.

The fuse network illustrated in FIG. 1 is subject to many different potential failure mechanisms from EOS or ESD, possibly leading to false readings of the state of fuse 1. For example, it has been determined that pull-down NFET 8 can have a MOSFET second breakdown event between its drain and the source in bulk CMOS and SOI applications. The ESD failure of NFET 8 forces the node low, resulting in having the receiver indicating that the fuse is still intact, when in fact, it could be open.

Erroneous states can also result from the ESD failure of pull-up PFET 6. For example, if VDD is grounded, and an ESD event occurs, the p-diffusion diode of the PFET 6 can forward bias. This leads to the current flow across the half pass NFET 4 leading to failure of both the PFET 6 and the NFET half pass NFET 4.

Figure 2:
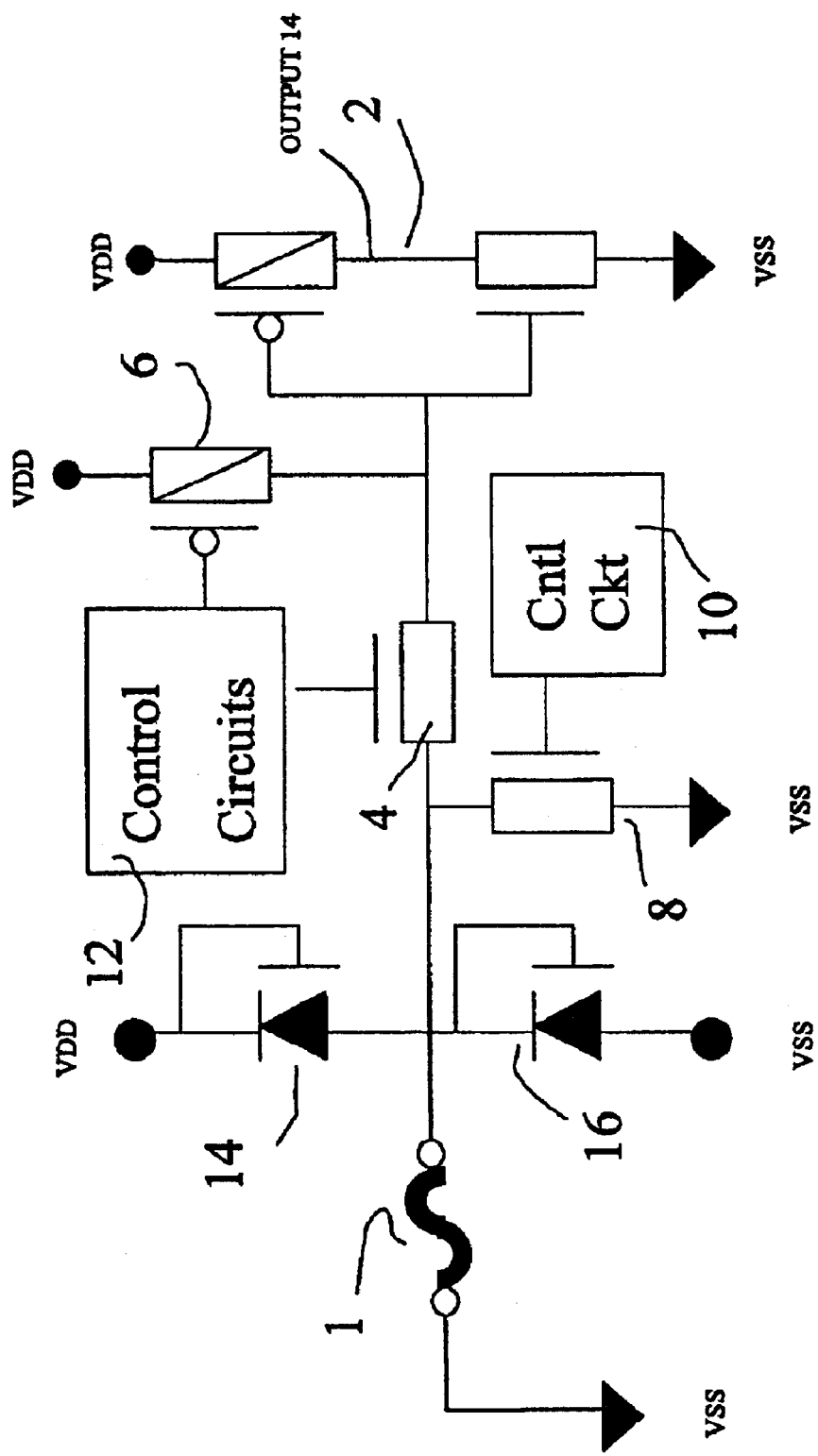
FIG. 2 is a schematic diagram illustrating an example of how the fuse network of FIG. 1 can be modified to include ESD and EOS protection according to the teachings of the present invention.

Reference now being made to FIG. 2, a schematic diagram is shown illustrating an example of how the fuse network of FIG. 1 can be modified to include ESD and EOS protection according to the teachings of the present invention. Gated diode structures 14 and 16 (also referred to as Lubistors) have been added to provide ESD and OSD protection. Both gated diode structures 14 and 16 include an anode, cathode and gate structure. The gate structure includes a polysilicon film and a thin dielectric MOSFET gate structure. In this implementation, the polysilicon film is doped n+ and p+ on the cathode and anode side, respectively. The gate structure(s) are connected to their respective cathode. As an alternative embodiment, the gate structures can be removed using additional masks.

These elements can provide ESD protection improvements from human body model (HBM), machine model (MM) and other pulse waveforms entering from the fuse electrode output node. In this implementation, it can be constructed in a CMOS technology (e.g., single well CMOS, twin well CMOS, triple well CMOS, RF CMOS), a silicon-on-insulator (SOI) technology, or a BiCMOS technology.

In the case of the SOI technology, the bodies of the NFET and PFET transistor can be floating or connected with body contacts. In SOI technology, it has been shown by the inventor that different failure mechanisms occur which are dissimilar to the events in bulk CMOS. For example, it has been shown that charged device model (CDM) failures occur in the half pass NFET 4 from the gate to the input node of the half pass NFET 4 when the node is shorted (e.g. Intact fuse 1 connected to ground). In this case, the CDM event can destroy the half pass NFET 4 and also lead to failure of the fuse element.

In SOI technology, it has been shown by the inventor that ESD failure from a CDM event can occur in the gated diode element 14 and gated diode element 16. When the ground rail (VSS) is charged negative, and the input node is grounded, the gated diode element 16 can have an CDM failure from the gate to the cathode. When the VDD is charged positive, CDM failure of the gated diode 14 can occur from the gate to the anode. Hence, this can lead to failure of the fuse 1 and a false reading of whether the fuse 1 is open or shorted. Hence, the introduction of SOI ESD networks to improve the robustness of the SOI fuse network leads to two new failure issues due to a CDM event. Also by connection of the gates of element 14 and element 16 leads to electrical overstress of the gates in overshoot or undershoot conditions.

Figure 3:
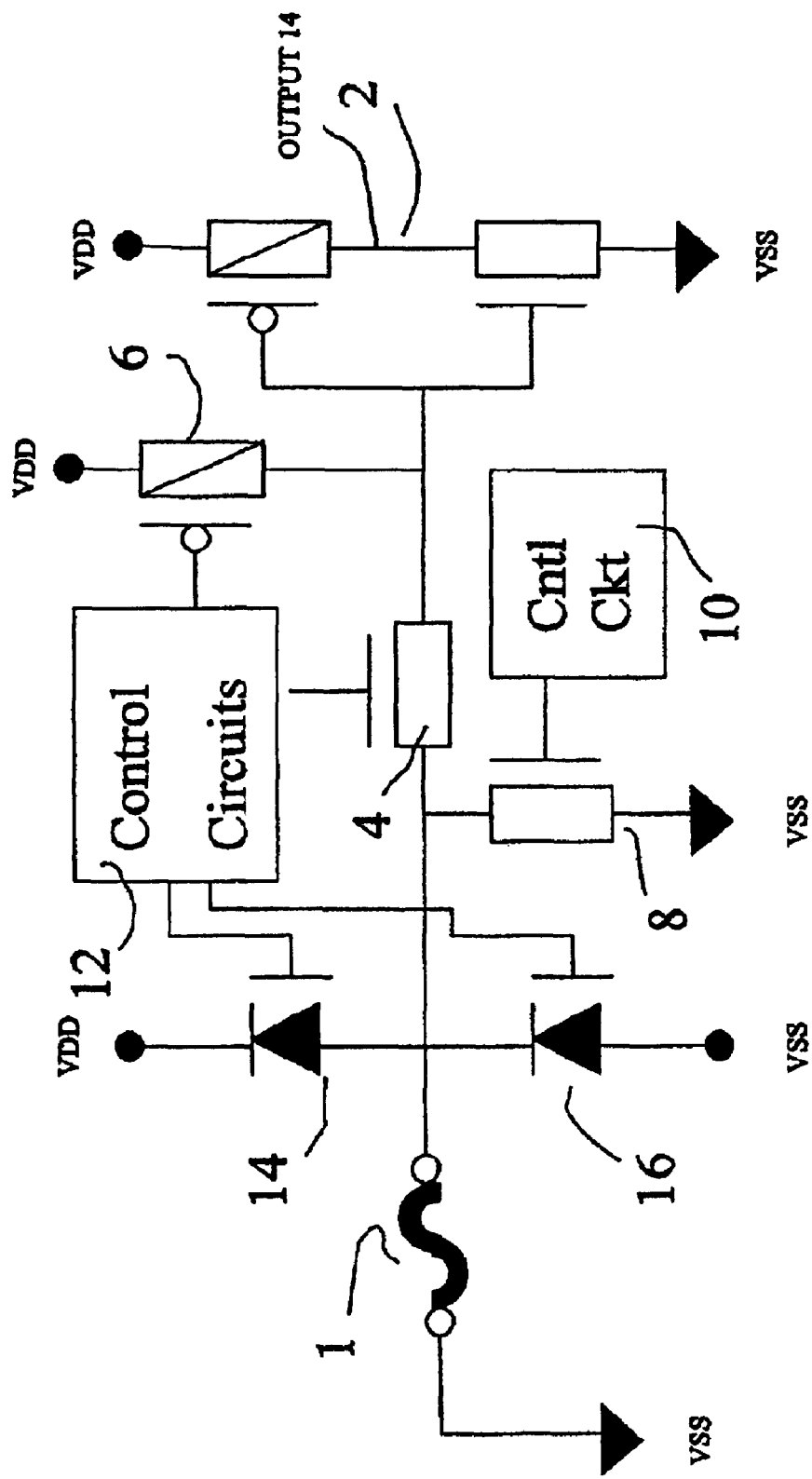
FIG. 3 is a schematic diagram illustrating the fuse network of FIG. 1 modified to avoid ESD, EOS, and CDM failures according to the teachings of the present invention.

Reference now being made to FIG. 3, a schematic diagram is shown illustrating the fuse network of FIG. 1 modified to avoid ESD, EOS, and CDM failures according to the teachings of the present invention. In this embodiment, the gated diode elements 14 and 16 are isolated from the power rails VDD and VSS to avoid CDM failures. This is accomplished by connected the gates of the diode elements 14 and 16 t the control circuit logic 12. Alternatively, the gates of the diode elements 14 and 16 could be controlled by other circuitry such as a gate biased network (e.g. invertor tied to ground).

Figure 4:
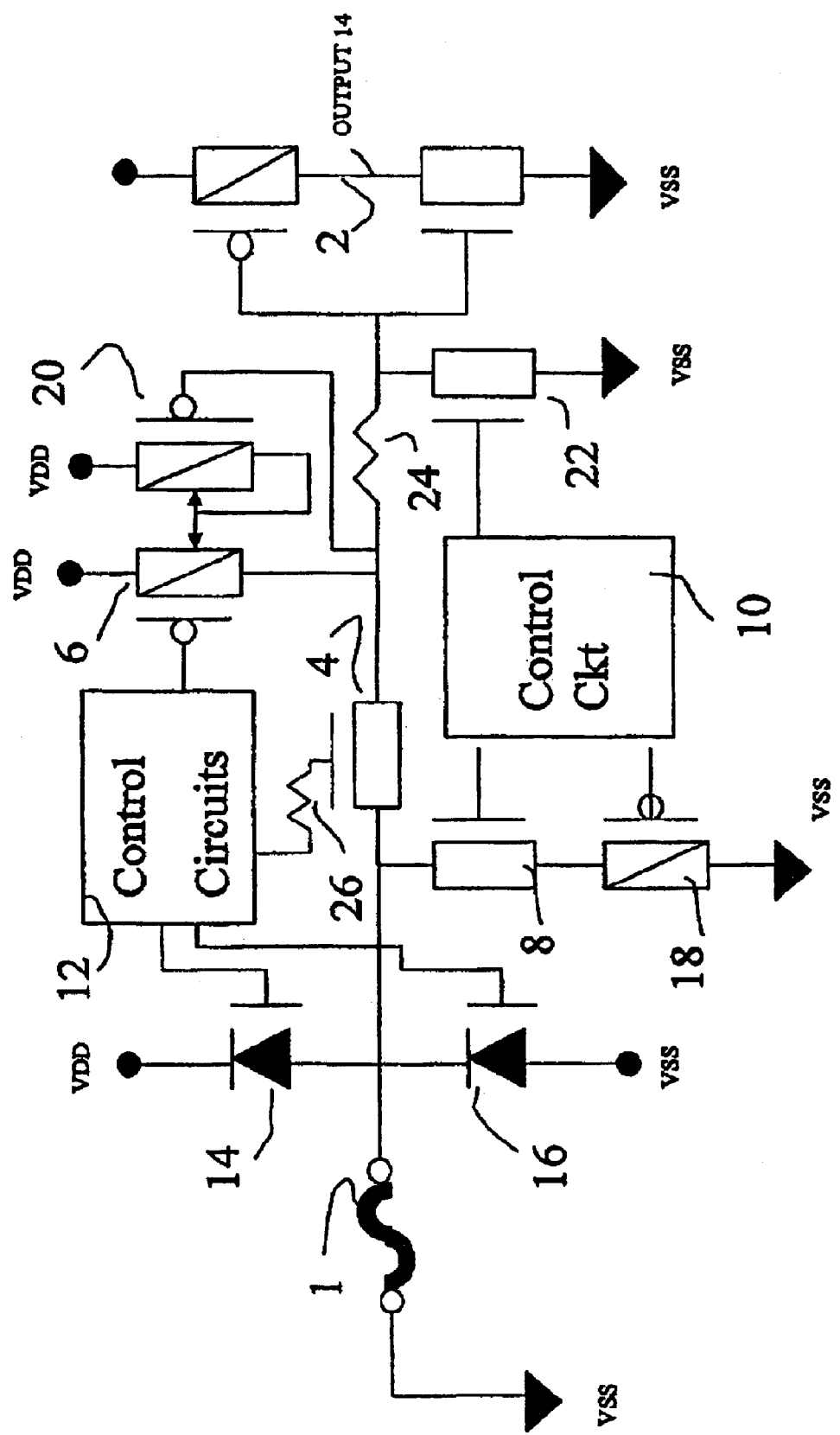
FIG. 4 is a schematic diagram illustrating the fuse network of FIG. 1 modified to avoid the introduction of ESD, EOS, and CDM failures according to the teachings of the present invention.

Reference now being made to FIG. 4, a schematic diagram is shown illustrating the fuse network of FIG. 1 modified to avoid the introduction of ESD, EOS, and CDM failures according to the teachings of the present invention. In this embodiment, additional measures are provided to avoid the misreading of the fuse 1 state. Specifically, PFET 18 is placed below NFET 8 to avoid having NFET element 8 undergo MOSFET second breakdown and leading to false reading of the fuse 1. The PFET 18 will not undergo MOSFET second breakdown from a positive pulse. Additionally, using the control circuit 10, the PFET 18 can be shutoff to insure that the NFET 8 does not have a path to ground even if it did have a MOSFET second breakdown failure. Thus, PFET 18 serves as a means to prevent electrical shorting, missreading, and as a means to isolate NFET 8 logically from the evaluation of the fuse 1. For example, to verify a low, the PFET gate 18 can be set low, and the NFET 8 can be set high via control circuit 10.

In order to avoid the pinning of the well of the pullup PFET 6, a second PFET 20 is placed such that the well of PFET 6 is not connected to VDD. For example, when the output of the half pass NFET 4 is high, PFET 20 is off leading the well of pullup PFET 6 to float, thus, preventing the pinning of the potential across the hall pass NFET 4.

From this example, it can be seen that the addition of PFET 20 avoids the electrical overstress of the pullup PFET 6 and/or failure of the half pass NFET 4 due to EOS or ESD events (e.g. from the pad signal).

To further improve the fuse network, a NFET 22 and resistor 24 have been coupled to the receiver inverter 2. The gate of the NFET 22 is connected to the control circuitry to avoid electrical overstress of the gate structure (e.g. avoiding the grounding of the gate to a VSS or ground rail), and to ensure that a CDM mechanism does not lead to failure. With the addition of the NFET 22 and resistor 24, the HBM and MM ESD robustness will improve (e.g. They form a resistor divider when the NFET 22 is on, reducing the voltage at the receiver inverter 2 input). Additionally, to avoid the CDM failure mechanisms observed in SOI technology a resistor element 26 is placed in series with the gate of the half pass NFET 4. This provides a robust pass transistor and avoids CDM failures.

The discussed modifications to the fuse network of FIG. 1 are applicable to CMOS, RF CMOS, BiCMOS, BiCMOS SiGe, BiCMOS SiGeC, strained Si, and other technologies which construct semiconductor products that require fuses. The fuse 1 can be, for example, constructed from aluminum, titanium/aluminum/titanium, copper, refractory metals, silicides, polysilicon and silicon elements.

Various modifications may be made to the structures of the invention as set forth above without departing from the spirit and scope of the invention as described and claimed. Various aspects of the embodiments described above may be combined and/or modified.

What is claimed is:

1. In an integrated circuit, a fuse network comprising:

a fuse;

ESD circuitry capable of providing ESD protection; and control circuitry capable of controlling the activation of the ESD circuitry and being protected by ESD events by the ESD circuitry, the control circuitry including an inverter capable of reading the status of the fuse, and a pass through transistor to gate the inverter.

2. The fuse network of claim 1 wherein the ESD circuitry includes:

a cascoded set of diodes each having a gate activated by the control circuitry.

3. The fuse network of claim 2 wherein the control circuitry includes:

a pfet coupled to the input of the inverter and the output of the pass through transistor.

4. The fuse network of claim 3 wherein the control circuitry includes a Nfet coupled in parallel with the input of the pass through transistor and cascoded set of diodes.

5. In an integrated circuit, a fuse network comprising:

a fuse a cascoded pair of lubistors coupled to the fuse, each one of the lubistors having a gate for activation a pass through NFET coupled to the pair of lubistors;

a NFET coupled to the source of the pass through NFET;

a first PFET coupled to the drain of the pass through NFET;

an inverter coupled to the drain of the pass through NFET; and control circuitry coupled to the gates of the lubistors.

6. The fuse network of claim 5 wherein the control circuitry is also coupled to the gates of the NFET and the first PFET.

7. The fuse network of claim 6 further comprising:
a second PFET coupled to the drain of the NFET for providing ESD protection to the NFET, the gate of the second PFET being activated by the control circuit.

8. In an integrated circuit, a fuse network comprising:
a fuse;
an inverter for reading the status of the fuse;
a pass through transistor for gating the inverter;
a PFET coupled to the input of the inverter and the output of the pass through transistor;
a control circuit for controlling the activation of the pass through transistor;
a cascoded set of diodes capable of providing ESD protection to the control circuit, pass through transistor, PFET, and inverter, the gate of the diodes being activated by the control circuit;
a NFET coupled in parallel with the input of the pass through transistor and cascoded set of diodes; and
a PPET coupled to the drain of the NFET and ground.

9. In an integrated circuit, a fuse network comprising:
a fuse;
control circuitry capable of controlling the reading circuitry;
an ESD circuit for protecting the reading circuitry and control circuitry from high voltage events, the ESD circuit being activated by the control circuitry;
reading circuitry capable of reading the value of the fuse, the reading circuitry including:
an inverter for reading the status of the fuse;
a pass through transistor for gating the inverter;
a PFET coupled to the input of the inverter and the output of the pass transistor; and
an NFET coupled in parallel with the input of the pass through transistor and the ESD circuit.

10. The fuse network of claim 9 wherein the control circuitry comprises:
a first control circuit capable of activating the NFET; and
a second control circuit capable of activating the PFET, and activating the ESD circuit.

11. The fuse network of claim 10 wherein the ESD circuit comprises a cascoded pair of lubistors.

* * * * *